United States Patent
Dikme

(10) Patent No.: US 9,951,442 B2
(45) Date of Patent: Apr. 24, 2018

(54) METHOD FOR PRODUCING A COMPOSITE BODY HAVING AT LEAST ONE FUNCTIONAL LAYER, OR FOR FURTHER PRODUCTION OF ELECTRONIC OR OPTO-ELECTRONIC COMPONENTS

(71) Applicant: AIXATECH GMBH, Baesweiler (DE)

(72) Inventor: Yilmaz Dikme, Baesweiler (DE)

(73) Assignee: AIXATECH GMBH, Baesweiler (DE)

( * ) Notice: Subject to any disclaimer, the term of this patent is extended or adjusted under 35 U.S.C. 154(b) by 0 days.

(21) Appl. No.: 15/037,854

(22) PCT Filed: Nov. 17, 2014

(86) PCT No.: PCT/EP2014/074739
§ 371 (c)(1),
(2) Date: May 19, 2016

(87) PCT Pub. No.: WO2015/074989
PCT Pub. Date: May 28, 2015

(65) Prior Publication Data
US 2016/0298261 A1    Oct. 13, 2016

(30) Foreign Application Priority Data

Nov. 19, 2013   (DE) ........................ 10 2013 112 785

(51) Int. Cl.
*H01L 29/04*     (2006.01)
*H01L 21/02*     (2006.01)
(Continued)

(52) U.S. Cl.
CPC ........ *C30B 25/186* (2013.01); *C23C 14/0036* (2013.01); *C23C 14/022* (2013.01);
(Continued)

(58) Field of Classification Search
CPC ....... C30B 25/186; C30B 25/06; C30B 25/18; C30B 23/025; C30B 29/06; C30B 29/20;
(Continued)

(56) References Cited

U.S. PATENT DOCUMENTS 4,461,689 A * 7/1984 Diepers ................. C23C 14/022
310/253
4,554,030 A * 11/1985 Haisma ............. H01L 21/02392
117/8

(Continued)

FOREIGN PATENT DOCUMENTS

CN    102498231 A    6/2012
DE    3136515        6/1982
(Continued)

OTHER PUBLICATIONS

International Search Report of International Application No. PCT/EP2014/074739, dated Feb. 20, 2015.

*Primary Examiner* — Benjamin Sandvik
*Assistant Examiner* — Gustavo Ramallo
(74) *Attorney, Agent, or Firm* — Bond Schoeneck & King, PLLC; George McGuire

(57) ABSTRACT

The invention relates to a process for producing a composite body (36) having at least one functional layer or for the further use for producing an electronic or optoelectronic component (40, 42, 44). The composite body (36) is in the form of a layer structure and comprises at least one substrate (34), which is in the form of a plate and has at least one planar substrate surface, and at least one substantially polycrystalline or at least one substantially single-crystal layer (38), which comprises at least one compound semiconductor, a ceramic material or a metallic hard material.
The process is characterized by the following steps:
heating at least part of the planar substrate surface to a temperature of at least 100° C. and at most 550° C.;
(Continued)

cleaning the substrate surface by supplying hydrogen from a first material source (20) and a plasma produced specifically therefor;

terminating the substrate surface by applying carbon, nitrogen or oxygen from the first material source (20) or a second material source (22) and a plasma produced specifically therefor; and growing the at least one layer (38) by supplying material components of the compound semiconductor, of the ceramic material or of the metallic hard material from the first material source (20) and the second material source (22) to the at least one planar substrate surface.

The invention also relates to the use of the composite body (36) produced according to one of the disclosed embodiments of the process or a combination thereof for producing an electronic or optoelectronic component.

14 Claims, 6 Drawing Sheets

(51) Int. Cl.

| | |
|---|---|
| C30B 25/18 | (2006.01) |
| C23C 14/02 | (2006.01) |
| C30B 23/02 | (2006.01) |
| C30B 29/40 | (2006.01) |
| C23C 14/00 | (2006.01) |
| C30B 25/06 | (2006.01) |
| C30B 29/06 | (2006.01) |
| C30B 29/20 | (2006.01) |

(52) U.S. Cl.
CPC .......... *C23C 14/024* (2013.01); *C30B 23/025* (2013.01); *C30B 25/06* (2013.01); *C30B 25/18* (2013.01); *C30B 29/06* (2013.01); *C30B 29/20* (2013.01); *C30B 29/403* (2013.01); *H01L 21/0254* (2013.01); *H01L 21/0262* (2013.01); *H01L 21/02631* (2013.01); *H01L 29/04* (2013.01)

(58) Field of Classification Search
CPC . C30B 29/403; C23C 14/0036; C23C 14/022; C23C 14/024; H01L 21/0254; H01L 21/0262; H01L 21/02631; H01L 29/04
See application file for complete search history.

(56) References Cited

U.S. PATENT DOCUMENTS

| | | | |
|---|---|---|---|
| 5,900,126 A | 5/1999 | Nelson | |
| 2004/0012015 A1* | 1/2004 | Saxler | ................ H01L 21/0237 257/18 |
| 2004/0200576 A1 | 10/2004 | Liu | |
| 2008/0182426 A1* | 7/2008 | Fujikura | ............... C30B 25/183 438/776 |
| 2012/0125765 A1 | 5/2012 | Ohmi | |

FOREIGN PATENT DOCUMENTS

| | | |
|---|---|---|
| DE | 19715572 | 10/1998 |
| EP | 1816672 | 8/2007 |
| JP | 2008166393 A | 7/2008 |
| JP | 2008182267 A | 8/2008 |
| JP | 2009512196 A | 3/2009 |
| JP | 2009161434 A | 7/2009 |
| JP | 2012074513 A | 4/2012 |
| JP | 2013001920 A | 1/2013 |

* cited by examiner

INTERLAYERS

5 – 40 x $x_1 > x_2 > x_3 > x_4$

1 – 5 x

METHOD FOR PRODUCING A COMPOSITE BODY HAVING AT LEAST ONE FUNCTIONAL LAYER, OR FOR FURTHER PRODUCTION OF ELECTRONIC OR OPTO-ELECTRONIC COMPONENTS

The present invention relates to a process for producing a composite body having at least one functional layer or for the further use for producing an electronic or optoelectronic component according to the preamble of Claim 1 and also to the use of a composite body produced in this manner for producing an electronic or optoelectronic component according to Claim 9.

PRIOR ART

A wide variety of processes are known in the prior art for producing electronic or optoelectronic components. By way of example, the process of metal-organic chemical vapour deposition (MOCVD) is widely used in the production of light-emitting diodes (LED) or laser diodes. In the case of layer structures based on gallium nitride (GaN), the process temperature for the MOCVD process is typically above 1000° C. The substrate used here is predominantly sapphire and also silicon and silicon carbide. The growth of GaN-based layers on foreign substrates (heteroepitaxy) presupposes that the substrate is cleaned at high temperatures, and is followed by a bonding or nucleation layer, before the actual layer structure (LED or transistor) follows. These steps are essential for the qualitative and reproducible growth of the layers and take up approximately 20-30% of the entire duration of the process. In order that the substrate is not parasitically coated by outgassing materials of the unintended concomitant reactor coating from the preceding process during cleaning of the substrates at high temperatures, the necessary purity requirements have to be satisfied before a substrate is loaded into the process chamber of the MOCVD plant. In the current prior art, this is done by replacing the coated apparatus with a cleaned reactor apparatus or by heating to a temperature suitable for cleaning the reactor apparatus.

By way of example, laid-open specification DE 197 15 572 A1 describes a process for producing epitaxial layers of a type III-V nitridic compound semiconductor of structure $In_xAl_yGa_{1-x-y}N$ ($0 \le x$, $0 \le y$, $x+y \le 1$) on a substrate made of single-crystal silicon. The process comprises process steps in which a zonal structure is produced on the surface of a substrate made of single-crystal silicon. The silicon surface is exposed in the zones, and the edges of the zones are surrounded by a masking material. The epitaxial growth of the nitridic compound semiconductor exclusively in the zones on the silicon surface produces local islands, at the edges of which the strain generated by the lattice mismatch can be degraded. Finally, components are produced in or on the zones.

European patent application EP 1 816 672 A1 proposes a process for producing substrates for the stress-free and crack-free deposition of semiconductor materials, in which a substrate made of semiconductor material is provided, a layer made of a second semiconductor material is applied to this substrate for producing a semiconductor layer structure, light gas ions are implanted into the semiconductor layer structure for producing a layer comprising cavities within the semiconductor layer structure, these cavities are stabilized by foreign atoms of a certain species and at least one epitaxial layer is applied to the semiconductor layer structure. In this way, it is possible to avoid rupturing of a layer deposited with associated high-temperature processes such as MOCVD at temperatures of greater than or equal to 1000° C.

Moreover, laid-open specification DE 31 36 515 A1 discloses a process for atomizing an element by means of a plasma source formed by a magnetron, wherein the plasma is generated between two faces of the source, which form an electrostatic field, and a generator anode mounted adjacent to the plasma ejects the plasma against the element to be atomized. Various possible applications are described, for instance the selective coating of substrates of differing electrical conductivity, the cleaning of substrates, ion milling, the recovery of expensive or dangerous coating materials, heating with little loss in the heating source, atomizing with reactive ions, sensitization or charge neutralization and also the pumping of active gases.

DISCLOSURE OF THE INVENTION

It is therefore, in particular, an object of the present invention to provide a process which has improvements in respect of the complexity for providing the process conditions and/or the process apparatus.

The present invention relates to a process for producing a composite body having at least one functional layer or for the further use for producing an electronic or optoelectronic component, the composite body being in the form of a layer structure and comprising:
- at least one substrate, which is in the form of a plate and has at least one planar substrate surface, and
- at least one substantially polycrystalline or at least one substantially single-crystal layer, which comprises at least one compound semiconductor, a ceramic material or a metallic hard material.

In this context, a "functional layer" is to be understood as meaning in particular a layer suitable for performing a specific function in respect of an electrical or optical application on account of an electrical or optical property.

The term "electronic or optoelectronic component" is to be understood as meaning in particular photovoltaic components, for instance solar cells, components for use in power electronics, for instance power transistors (IGBTs), thyristors, etc., components for use in radiofrequency technology, for example HEMTs (high electron-mobility transistor), and also light-emitting and laser diodes.

In this context, "substantially" is to be understood as meaning in particular a proportion of more than 50%. In particular, a proportion of 100% should also be included.

The process comprises the following steps:
- heating at least part of the planar substrate surface to a temperature of at least 100° C. and at most 550° C.;
- cleaning the substrate surface by supplying hydrogen from a first material source and a plasma produced specifically therefor;
- terminating the substrate surface by applying carbon, nitrogen or oxygen from the first material source or a second material source and a plasma produced specifically therefor; and
- growing the at least one layer by supplying material components of the compound semiconductor, of the ceramic material or of the metallic hard material from the first material source and the second material source to the at least one planar substrate surface.

In this context, the term "compound semiconductor" is intended to include in particular compounds with semiconductor properties which are formed by compounds of elements of main group II with elements of main group VI of the Periodic Table of the Elements (PTE), compounds of elements of main group III with elements of main group V, compounds of elements of main group III with elements of main group VI, compounds of elements of main group I with elements of main group III and elements of main group VI, compounds of elements of main group III with elements of main group VI and also compounds of different elements of main group IV of the PTE.

In this context, a "metallic hard material" is to be understood as meaning in particular a layer having a Vickers hardness of more than 1000 VH and/or a Mohs hardness of more than 9.0 which has a predominant proportion of metallic bonds. One example of such a metallic hard material is titanium nitride (TiN).

In this context, the term "ceramic material" is intended to comprise in particular non-oxidic ceramic materials. Examples of such ceramic materials are silicon nitride ($Si_3N_4$) and boron carbide ($B_4C$).

In this context, "terminating the substrate surface" is to be understood as meaning in particular a transformation of the substrate in the uppermost up to five monolayers of the substrate surface.

The termination of the substrate surface by applying nitrogen (nitriding) can be effected substantially with nitrogen, with or without proportions of argon and/or helium, or with nitrogen compounds, with or without proportions of argon and/or helium.

The termination of the substrate surface by applying oxygen (oxidizing) can be effected substantially with oxygen, with or without proportions of argon and/or helium, or with oxygen compounds, with or without proportions of argon and/or helium.

The termination of the substrate surface by applying carbon (carbonizing) can be effected substantially with carbon, with or without proportions of argon and/or helium, or with carbon compounds, with or without proportions of argon and/or helium.

In one embodiment, the substrate in the form of a plate can have a single-crystal form and can comprise, for example, sapphire, silicon, lithium aluminate, silicon carbide, gallium nitride, gallium arsenide, germanium or zirconium diboride. In another embodiment, the substrate can also have a polycrystalline or amorphous form and can comprise, for example, glass, polysilicon, films, plastics, paper, ceramic and metallic wafers, for example tungsten-copper.

In said process, the process temperature is reduced considerably compared to the known prior art. As a result, it is possible to shorten process times for producing the composite body and to reduce the expenditure of energy and costs required. Furthermore, thermal stresses which arise during the production can be reduced as a result of the lowered temperature compared to the prior art, and therefore the quality and durability of the composite body can be increased.

It is particularly advantageous to heat part of the planar substrate surface to a temperature of at least 100° C. and at most 300° C. if the at least one layer comprising a compound semiconductor is substantially polycrystalline. By contrast, it is advantageous to heat part of the planar substrate surface to a temperature of at least 100° C. and at most 550° C. if the at least one layer comprising a compound semiconductor has a substantially single-crystal form.

In an advantageous configuration of the process, the components of the compound semiconductor, of the ceramic material or of the metallic hard material are supplied by means of sputtering, plasma-enhanced chemical vapour deposition PECVD or by means of at least one ion cannon. As a result, the at least one layer comprising at least one compound semiconductor can be produced in a reliable and reproducible manner. In this context, an "ion cannon" is to be understood as meaning in particular an apparatus in which material is ionized and accelerated directed by means of an acceleration voltage.

The material supplied from the material sources can be present as a solid body substantially in pure form, in a metal-organic form or as an alloy, which can be introduced in evaporated, sputtered or heated form by way of a carrier gas. The material can also be present as a gas or gas compound, which can be introduced in heated form by way of a carrier gas. The material can furthermore be present as a liquid compound, in a metal-organic form or as an alloy, which are introduced in evaporated, sputtered or heated form by way of a carrier gas.

It is particularly advantageous that the components of the compound semiconductor, of the ceramic material or of the metallic hard material are supplied by means of a strip source. By way of example, the strip source can consist of a strip element, through which all source materials required for supplying the components of the compound semiconductor, of the ceramic material or of the metallic hard material are conducted together;

comprise a plurality of strip elements, through which all required source materials are conducted individually or combined in relatively small groups;

be in the form of a strip magnetron source;

be in the form of a tubular magnetron source;

be in the form of a strip evaporator;

comprise a plurality of evaporator stations, which together form a strip;

comprise a plurality of ion cannons, which together form a strip;

be in the form of a strip ion cannon;

have a strip mask equipped with one or more slots through which the source materials required emerge; or have a strip mask comprising a screen inlet through which the source materials required emerge.

The use of the strip source makes it possible for the at least one layer comprising at least one compound semiconductor to be produced in a particularly short process time and in a particularly uniform manner.

Furthermore, it is proposed that the components of the compound semiconductor, of the ceramic material or of the metallic hard material are supplied by means of at least two different strip sources, of which at least one strip source comprises an ion cannon. As a result, the at least one layer comprising at least one compound semiconductor can be produced in a particularly flexible manner in respect of operating conditions.

In a further advantageous configuration of the process, the substrate is moved in relation to at least one of the material sources at least as the steps of termination and of growth are being carried out. As a result, it is possible to achieve particularly uniform layer thicknesses of the at least one layer comprising at least one compound semiconductor.

If the steps of the process are performed in at least two different vacuum-compatible reactors, the reactors being connected to one another by vacuum locks, it is advantageously possible to achieve a particularly high throughput rate during the production of the composite bodies. In this context, a "vacuum-compatible" reactor is to be understood as meaning in particular a chamber in which it is possible to achieve a vacuum with a gas pressure in a range of between 0.1 Pa and $10^{-5}$ Pa (1 Pa≙1 N/m$^2$) by means of a suitable pumping apparatus. In this case, an operating pressure during operation of the reactor can also lie above 0.1 Pa, for example between 0.1 Pa and 10 Pa.

A further aspect of the invention is a process for producing an electronic or optoelectronic component by applying a plurality of semiconductor-comprising layers to a composite body, which has been produced in accordance with an embodiment of the processes disclosed above or a combination thereof. In this case, the process has the same advantages in terms of a shortened process time, a reduced expenditure of energy and costs and reduced thermal stresses arising during the production as the process for producing the composite body.

Here, after it has been produced, the composite body having the at least one layer comprising at least one compound semiconductor can be subjected directly to the process for producing an electronic or optoelectronic component. After it has been produced, the composite body can also be transported, however, to a different production plant, in particular an MOCVD plant, in order to thereby produce the electronic or optoelectronic component.

In an advantageous, further-developed embodiment of the process, the plurality of semiconductor-comprising layers comprise interlayers, which serve for reducing mechanical stresses within the composite body. In this case, the interlayers can be configured, for example, in a manner known to a person skilled in the art, as a gradient layer between layers comprising two different semiconductors, as layers which have a thinner configuration compared to layers comprising two different semiconductors and alternately comprise in each case one of the two different semiconductors, or as layers which are produced at a different process temperature.

A further aspect of the invention is the use of the composite body produced in accordance with an embodiment of the processes disclosed above or a combination thereof for producing an electronic or optoelectronic component by applying a plurality of semiconductor-comprising layers to the composite body.

This is advantageous particularly when the production plant for producing the electronic or optoelectronic component, which in particular can be in the form of an MOCVD plant, in the form of a molecular beam epitaxy (MBE) plant or in the form of a hydride vapour phase epitaxy (HVPE) plant, has a significantly more complex configuration and is therefore more expensive both in terms of acquisition and in terms of operating costs than the production plant for producing the composite body. The termination of the substrate surface and the coating thereof with a start layer can make it possible to transport the composite body without vacuum conditions and to produce the electronic or optoelectronic component in the production plant intended therefor without preparative cleaning or application of a start layer, and therefore the composite bodies can also be produced as stock items and can be transported to the production plant for producing the electronic or optoelectronic component.

A further-developed use of the composite body produced in accordance with an embodiment of the processes disclosed above or a combination thereof for producing an electronic or optoelectronic component is particularly advantageous if the plurality of layers comprise interlayers, which serve for reducing mechanical stresses within the composite body. The interlayers can be configured in the above-described manner known to a person skilled in the art.

The composite bodies produced in accordance with an embodiment of the processes disclosed above or a combination thereof can particularly advantageously be used for producing an electronic or optoelectronic component if the plurality of semiconductor-comprising layers are applied by a process which is selected from a group consisting of metal-organic chemical vapour deposition MOCVD, molecular beam epitaxy MBE or hydride vapour phase epitaxy HVPE.

DRAWING

Further advantages become apparent from the following description of the drawing. The drawing shows an exemplary embodiment of the invention. The drawing, the description and the claims contain numerous features in combination. A person skilled in the art will expediently also consider the features individually and combine them to form expedient further combinations.

In the drawing:

FIG. 1 shows a schematic, perspective illustration of a composite body which can be produced by a process according to the invention, FIG. 2A, FIG. 2B and FIG. 2C show schematic illustrations of electronic and optoelectronic components which can be manufactured using composite bodies which can be produced by a process according to the invention, FIG. 3A, FIG. 3B, FIG. 3C and FIG. 3D show a plurality of embodiments of interlayers, FIG. 4 shows a schematic illustration of a complete system for carrying out the process according to the invention for producing a composite body as shown in FIG. 1, FIG. 5 shows an alternative embodiment of a complete system for carrying out the process according to the invention for producing a composite body as shown in FIG. 1, and FIG. 6 shows a schematic illustration of a reactor of the complete systems as shown in FIG. 4 and FIG. 5 for carrying out the process according to the invention.

DESCRIPTION OF THE EXEMPLARY EMBODIMENTS

FIG. 4 shows a schematic illustration of a complete system 10 for carrying out the process according to the invention for producing a composite body 36 in the form of a layer structure (FIG. 1). The complete system 10 has a loading and unloading chamber 12, a transfer chamber 14 and a reactor 18. A multiplicity of wafer plates 32, in this specific exemplary embodiment sixteen wafer plates 32, can be mounted spaced apart vertically in the loading and unloading chamber 12, in which normal ambient air pressure prevails during the loading and unloading, said wafer plates each comprising at least one substrate 34, in the form of a plate, having a planar substrate surface. The transfer chamber 14 is connected by way of one of its end faces to the loading and unloading chamber 12 and by way of the other end face to the reactor 18. At each of its two end faces, the transfer chamber 14 has a passage opening, this being configured in terms of size for the passage of a wafer plate 32 and being equipped on each side with a vacuum lock $16_1$, $16_2$.

In principle, the complete system 10 can also be designed without a transfer chamber 14, particularly when there is no risk of cross-contamination.

The loading and unloading chamber 12 and also the reactor 18 likewise have a passage opening configured in terms of size for the passage of a wafer plate 32 at a side facing towards the transfer chamber 14. The transfer chamber 14 is equipped with a transport system (not shown), which is provided, in order to produce a composite body 36, to transport one of the wafer plates 32 through the passage opening facing towards the loading and unloading chamber 12 through the transfer chamber 14 to the passage opening facing towards the reactor 18, and to transfer said wafer plate to a transport system of the reactor 18. Furthermore, the transport system of the transfer chamber 14 is provided, after the production of the composite body 36 in the reactor 18, to accept the wafer plate 32 at the passage opening facing towards the reactor 18, to transport said wafer plate through the transfer chamber 14 to the passage opening facing towards the loading and unloading chamber 12, and to deposit said wafer plate in the loading and unloading chamber 12.

The transfer chamber 14 and the vacuum locks $16_1$, $16_2$ thereof and also the reactor 18 and the loading and unloading chamber 12 are vacuum-compatible and can be evacuated by means of a suitable pumping apparatus (not shown) to a gas pressure in a range of between 0.1 Pa and $10^{-5}$ Pa, it being possible for an operating pressure in the operational state of the reactor 18 to also lie above 0.1 Pa, for example up to 10 Pa.

The complete system 10 as shown in FIG. 4 can be upgraded by the addition of one or more further units 46' (shown by dashed lines), which comprise a transfer chamber 14' and a reactor 18' connected to the transfer chamber 14' in the manner described above, such that steps of the production process could be performed in at least two different vacuum-compatible reactors 18, 18', with the reactors 18, 18' being connected to one another by vacuum locks $16_3$, $16_4$.

An alternative configuration of a complete system is shown in FIG. 5. In order to distinguish this configuration from the complete system 10 shown in FIG. 4, the numeral 2 has been placed in front of all reference signs in this embodiment. In an embodiment of this type, the complete system 210 is particularly advantageously equipped with a second loading and unloading chamber 212' connected to the reactor 218' via an additional transfer chamber 214', wherein, by way of example, the first loading and unloading chamber 212 serves exclusively as a loading chamber and the second loading and unloading chamber 212' serves exclusively as an unloading chamber, and wherein one of the transport systems described is likewise installed in the additional transfer chamber 214'. In this way, it is possible to achieve a particularly efficient material flow, formed by the wafer plates 232, through the complete system 210, it being readily apparent to a person skilled in the art that a direction of the material flow is also possible in the opposite direction as a result of suitable measures. As in the exemplary embodiment shown in FIG. 4, the transfer chambers 214, 214' of the complete system 210 are optional if there is a low risk of cross-contamination.

The complete system 10 as shown in FIG. 4 can be upgraded by the addition of one or more further units 46' (shown by dashed lines), which comprise a transfer chamber 14' and a reactor 18' connected to the transfer chamber 14' in the manner described above, such that steps of the production process could be performed in at least two different vacuum-compatible reactors 18, 18', with the reactors 18, 18' being connected to one another by vacuum locks 163, 164.

FIG. 6 shows a schematic illustration of the reactor 18 of the complete system 10. A first material source 20 and a second material source 22 are arranged next to one another in an upper region within the reactor 18. In principle, the reactor 18 can also comprise further material sources. A further material source 20' of this type is shown in FIG. 6 by a dashed line.

The first material source 20 is in the form of a strip ion cannon as a first strip source with a first direction of extent of a strip. Gas (argon gas and/or oxygen gas and/or nitrogen gas and/or hydrogen gas and/or methane gas, etc.) can be supplied to the first material source 20 via first gas lines 24. The first component of the compound semiconductor is supplied during the production operation by means of the first strip source by activating the strip ion cannon.

The second material source 22 is in the form of a tubular magnetron or strip magnetron as a second strip source with a second direction of extent of a strip. Gas (argon gas and/or oxygen gas and/or nitrogen gas and/or hydrogen gas and/or methane gas, etc.) can be supplied to the second material source 22 via second gas lines 26. A metallic target (not shown), which comprises a second component of a compound semiconductor, is arranged within the tubular magnetron. The second component of the compound semiconductor is supplied during the production operation by means of the second strip source by sputtering by activating the tubular magnetron.

Therefore, the components of the compound semiconductor are supplied by means of at least two different strip sources, of which one strip source comprises an ion cannon.

In the embodiment of the reactor 18 shown in FIG. 6, the material sources 20, 20', 22 and the wafer plate 32 are arranged in such a way that the components of the compound semiconductor are supplied in a substantially vertical direction from the top downwards. For other applications, however, it may also be expedient to choose an arrangement in which the components of the compound semiconductor are supplied in a substantially lateral direction or in a substantially vertical direction from the bottom upwards, in which case an arrangement of the material sources 20, 20', 22 and of the wafer plate 32 is to be configured correspondingly.

The first material source 20 and the second material source 22 are arranged in such a way that the first direction of extent and the second direction of extent run substantially parallel to one another and are oriented on a common line. The common line can be arranged in the immediate vicinity of the surface (distance of less than 10 mm) of the wafer plate 32. In an alternative configuration, the material sources could also be oriented in such a way that the common line runs at a distance from the wafer plate 32 (distance of more than 20 mm).

A lower region of the reactor 18 is provided with a transport system (not shown), which is provided for moving the wafer plate 32 to and fro in relation to the first material source 20 and the second material source 22. Here, the movement is made in a substantially translatory manner with low eccentricity, it being possible for the translatory movement to be carried out both perpendicularly and parallel to the first direction of extent and the second direction of extent.

Below the wafer plate 32, the reactor 18 is equipped with a heating apparatus 28, which when activated can heat the wafer plate 32 to a temperature of at most 550° C. In principle, in an alternative embodiment, the heating apparatus 28 can also be arranged above the wafer plate 32 (not shown), or heating apparatuses 28 can be provided above and below the wafer plate 32.

The reactor 18 is furthermore equipped with an apparatus 30 for accelerating and/or exciting the atomized particles (DC-bias or RF-bias).

The text which follows describes steps of the process for producing the composite body 36. In this case, it is assumed that the first material source 20 and the second material source 22 and the associated first gas lines 24 and second gas lines 26 thereof are in an operational state, the gas pressure in the reactor 18 moves within the operating pressure range described and the wafer plate 32 is held in the transport system of the reactor 18.

In a first step of the process, the wafer plate 32 is heated by means of the heating apparatus 28 to a temperature of at least 100° C. and at most 550° C.

In a next step of the process, the substrate surface is cleaned by supplying hydrogen gas from the first gas lines 24 of the first material source 20 and a plasma produced specifically therefor.

In a subsequent step, the substrate surface is terminated by applying carbon, nitrogen or oxygen from the second material source 22 and a plasma produced specifically therefor.

In a following step, the at least one layer which comprises at least one compound semiconductor, a ceramic material or a metallic hard material is grown by supplying material components of the at least one compound semiconductor, of the ceramic material or of the metallic hard material from the first material source 20 and the second material source 22 to the at least one planar substrate surface.

As the steps of termination and of growth are being carried out, the chosen wafer plate 32 comprising the substrate 34 in the form of a plate is moved by means of the transport system of the reactor 18 in relation to the first material source 20 and the second material source 22, as a result of which it is possible to achieve a particularly uniform layer thickness and quality of the substantially polycrystalline or substantially single-crystal layer comprising at least one compound semiconductor.

FIG. 1 shows a schematic illustration of the composite body 36 which is in the form of a layer structure and which has been produced by a process according to the invention, the embodiment of which is described above. The composite body 36 comprises the substrate 34 which is in the form of a plate and has the planar substrate surface. Furthermore, the composite body 36 comprises a termination layer 52 and at least one substantially polycrystalline or at least one substantially single-crystal layer 38, which comprises at least one compound semiconductor, a ceramic material or a metallic hard material.

The text which follows describes examples of composite bodies 36 which have at least one functional layer or are provided for the further use for producing an electronic or optoelectronic component 40, 42, 44.

Exemplary Embodiment 1

The substrate 34 has an amorphous form and consists of a window glass pane. The functional layer has a polycrystalline form and comprises a compound semiconductor, which consists of indium tin oxide (ITO) and serves as integrated thermal protection for the window glass pane or as a transparent, electrically conductive layer.

In this exemplary embodiment, the planar substrate surface is heated to a temperature of 100° C. The substrate surface is terminated by applying nitrogen ("nitriding") from the first material source 20 and a plasma produced specifically therefor.

Exemplary Embodiment 2

For other uses, the polycrystalline functional layer can comprise other compound semiconductors, for example indium gallium zinc oxide, copper indium gallium diselenide or gallium nitride, and can be arranged on a different substrate 34, in which case the substrate 34 of the composite body 36 is matched to the use and can be formed by amorphous or polycrystalline materials, such as polysilicon, plastic film, paper, ceramic and metallic wafers, for example made of tungsten-copper.

Exemplary Embodiment 3

The structure shown in FIG. 1 of the composite body 36 in the form of a layer structure corresponds substantially to a structure of composite bodies 36 for the further use for producing an electronic or optoelectronic component 40, 42, 44, in which case the substrate 34 of the composite bodies 36 is matched to this use. In this exemplary embodiment, the substrate 34 of the composite body 36 has a single-crystal form and consists of sapphire.

In this exemplary embodiment, the planar substrate surface is heated to a temperature of 500° C.

The substrate surface is terminated, after the substrate surface has been cleaned, by applying nitrogen ("nitriding") from the first material source 20 and a plasma produced specifically therefor. The at least one layer 38 comprising the compound semiconductor aluminium nitride (AlN) is grown by supplying nitrogen as a first material component of the compound semiconductor from the first material source 20 and by simultaneously supplying aluminium from a solid sputtering target as a second material component of the compound semiconductor from the second material source 22 to the substrate surface.

Exemplary Embodiment 4

In this exemplary embodiment, the composite body 36 is likewise provided for the further use for producing an electronic or optoelectronic component 40, 42, 44. The substrate 34 of the composite body 36 has a single-crystal form and consists of silicon, which can have various orientations ((111), (110), (100)) and can be On- or Off-oriented.

In this exemplary embodiment, the planar substrate surface is heated to a temperature of 550° C.

The substrate surface is terminated, after the substrate surface has been cleaned, by applying carbon ("carbonizing") from the first material source 20, to which methane gas is supplied through one of the first gas lines 24, and a plasma produced specifically therefor. The at least one layer 38 comprising the compound semiconductor gallium nitride (GaN) is grown by supplying nitrogen as a first material component of the compound semiconductor from the first material source 20 and by simultaneously supplying gallium from a solid sputtering target consisting of gallium nitride as a second material component of the compound semiconductor from the second material source 22 to the substrate surface.

Exemplary Embodiment 5

In this exemplary embodiment, the composite body 36 is likewise provided for the further use for producing an electronic or optoelectronic component 40, 42, 44. The substrate 34 of the composite body 36 has a single-crystal form and consists of silicon.

In this exemplary embodiment, the planar substrate surface is heated to a temperature of 450° C.

The substrate surface is terminated, after the substrate surface has been cleaned, by applying carbon ("carbonizing") from the first material source 20, to which methane gas is supplied through one of the first gas lines 24, and a plasma produced specifically therefor. The at least one layer 38 comprising the compound semiconductor aluminium gallium nitride (AlGaN) is grown by supplying nitrogen as a first material component of the compound semiconductor from the first material source 20 and by simultaneously supplying aluminium and gallium from a solid AlGaN sputtering target as a second and third material component of the compound semiconductor from the second material source 22 to the substrate surface.

The process described can also be utilized for producing an electronic or optoelectronic component 40, 42, 44 by applying a plurality of semiconductor-comprising layers 38 to a composite body 36, in that the step of growing a layer 38 comprising at least one compound semiconductor with the corresponding material components is repeated several times using a composite body 36 which has been produced.

The composite bodies 36 produced by the process described can alternatively be removed from the complete system 10 and transported to other production plants for producing the electronic and optoelectronic components 40, 42, 44, in which case the composite bodies 36 can be exposed to the normal external atmosphere during transportation. The production plants can in this case involve a process, for example, which is selected from a group consisting of metal-organic chemical vapour deposition (MOCVD), molecular beam epitaxy (MBE) or hydride vapour phase epitaxy (HYPE).

FIG. 2a-2c show, in a greatly schematized manner, electronic and optoelectronic components 40, 42, 44 which can be manufactured using composite bodies 36 which can be produced by a process according to the invention, in schematic illustrations. The electronic and optoelectronic components 40, 42, 44 are configured as a solar cell 40 (FIG. 2a), as an HEMT 42 ("high electron-mobility transistor", FIG. 2b) and as an LED 44 ("light-emitting diode", FIG. 2c).

In FIG. 2a-2c, the nature of each of the plurality of semiconductor-comprising layers 38 is denoted. A component of a compound semiconductor placed between parentheses is to be understood as being optional. Indications in relation to the doping of the compound semiconductors correspond to conventional agreement. "MQW" (multi quantum well) is the designation for a multi quantum well which is known from the prior art and is conventionally produced by using the MOCVD process.

The sequence of semiconductor-comprising layers 38 which is shown in FIGS. 2a and 2c further comprises interlayers 48, 48', 48", which serve for reducing mechanical stresses within the composite body 36, are arranged between the semiconductor-comprising layers 38 and are known from the prior art.

Exemplary configurations of interlayers 48, 50 are shown in FIG. 3a-3d. FIG. 3a shows an interlayer 48' consisting of an individual layer made of the compound semiconductor aluminium nitride (AlN).

Figure 1:
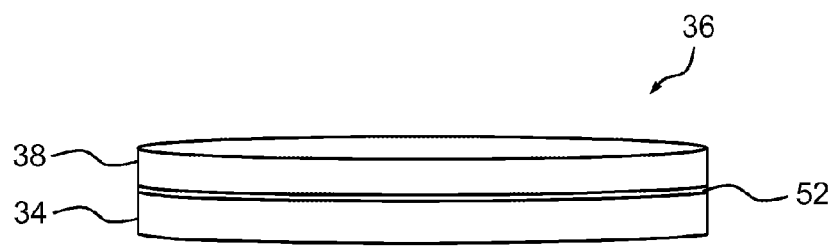
Figure 2A:
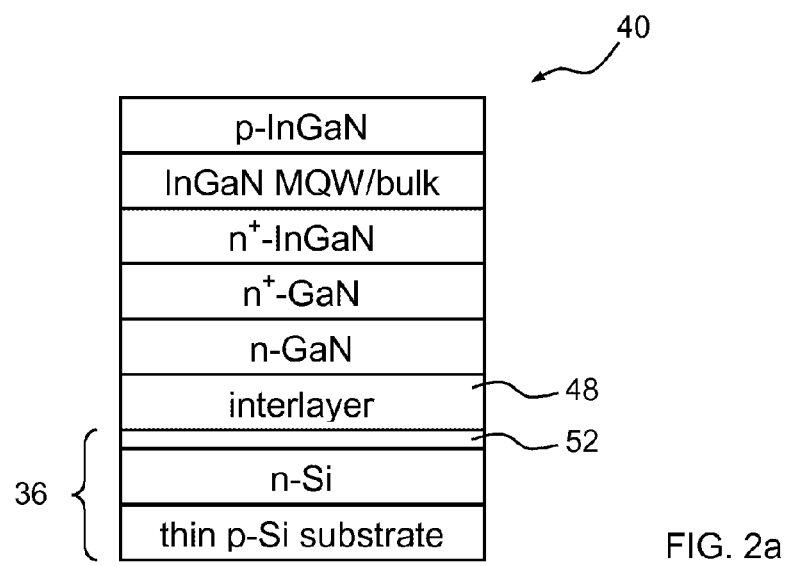
Figure 2B:
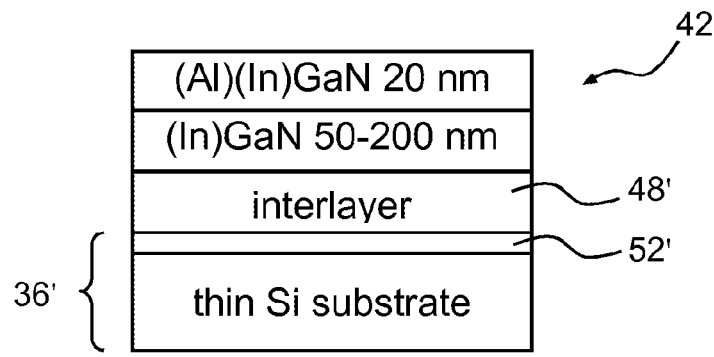
Figure 2C:
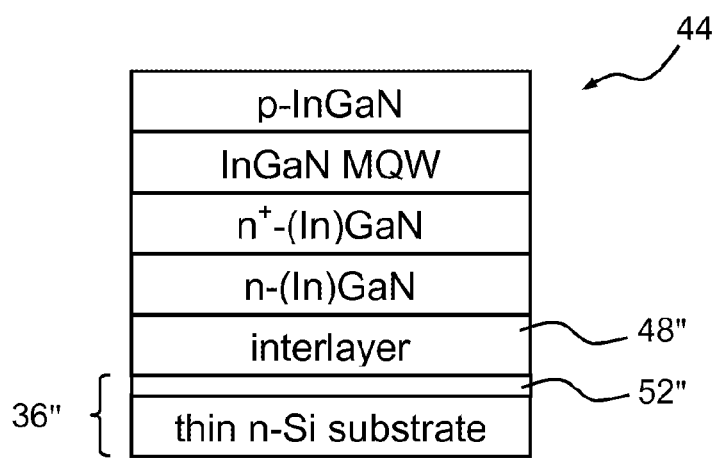
Figure 3A:
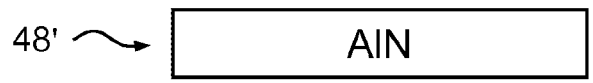
FIG. 3b shows an interlayer 50 in the form of a superlattice structure, in which a sequence of two layers made of the compound semiconductor AlInGaN with a differing concentration of the components aluminium, indium and gallium is repeated. The number of repetitions of the two layers is typically between five and 40.
FIG. 3c shows an interlayer 50' which is in the form of a gradient structure of the compound semiconductor aluminium gallium nitride (AlGaN).
Figure 3B:
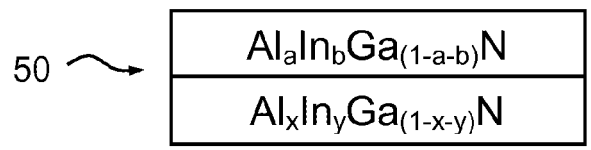
Figure 3C:
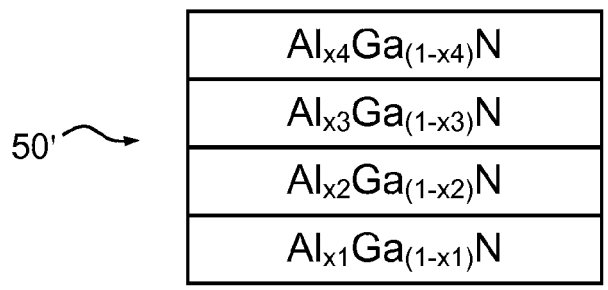
Figure 3D:
Figure 4:
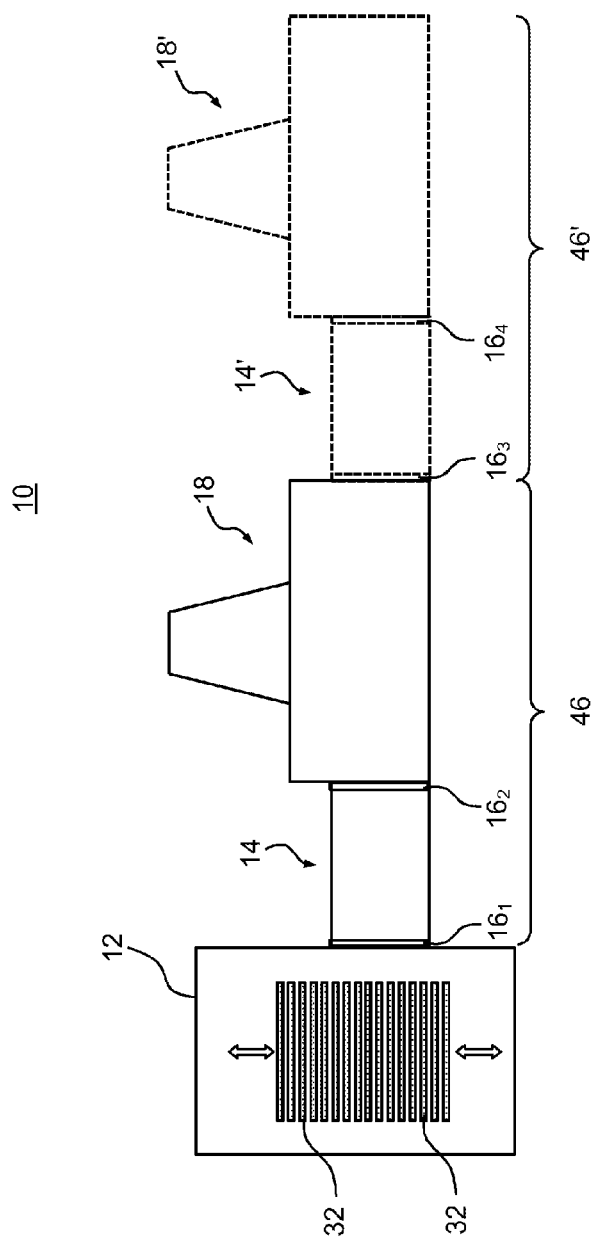
Figure 5:
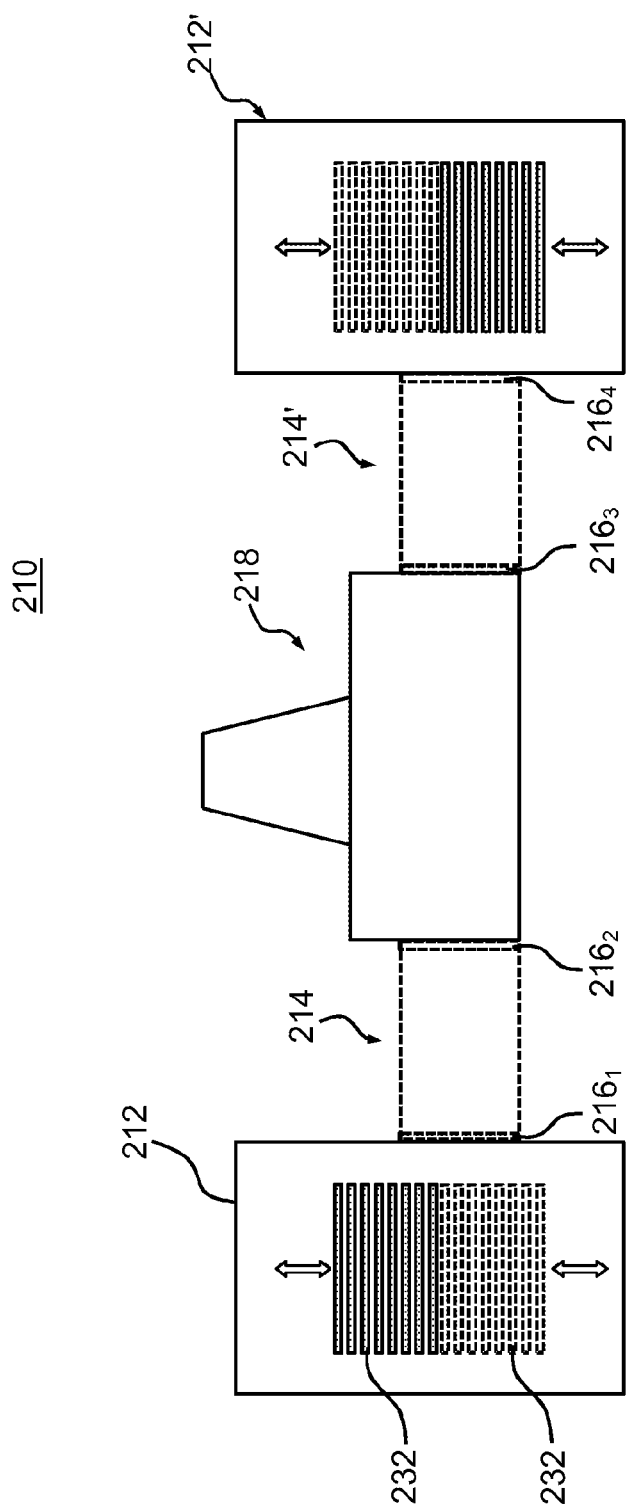
Figure 6:
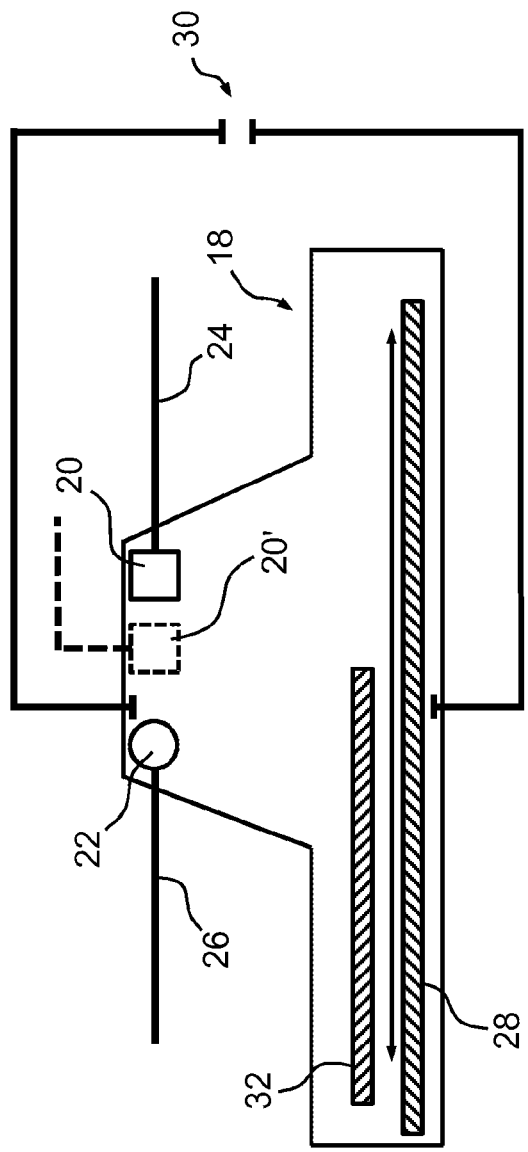

The embodiment of an interlayer 50" shown in FIG. 3d involves a sequence of two layers of the compound semiconductor aluminium nitride (AlN), in which the bottom layer has been produced at a lower temperature (LT: low temperature) of the wafer plate 32 than the top layer (HT: high temperature).

LIST OF REFERENCE SIGNS

10 Complete system
12 Loading and unloading chamber
14 Transfer chamber
16 Vacuum lock
18 Reactor
20 First material source
22 Second material source
24 First gas lines
26 Second gas lines
28 Heating apparatus
30 Capacitively coupled RF discharge
32 Wafer plate
34 Substrate
36 Composite body
38 (Compound semiconductor) layer
40 Electronic or optoelectronic component
42 Electronic or optoelectronic component
44 Electronic or optoelectronic component
46 Unit
48 Interlayer
50 Interlayer
52 Termination layer

The invention claimed is:

1. A method for producing a composite body having a layer structure and comprising: at least one substrate, which is in the form of a plate and has at least one planar substrate surface, and at least one substantially polycrystalline or at least one substantially single-crystal layer, which comprises at least one compound semiconductor, a ceramic material, or a metallic hard material, wherein the method comprises the steps to be performed in the following order of:
   heating at least part of the planar substrate surface to a temperature of at least 100° C. and at most 550° C.;
   cleaning the substrate surface by supplying hydrogen from a first material source and a plasma produced specifically therefor;
   terminating the substrate surface by applying carbon, nitrogen, or oxygen from the first material source or a second material source and a plasma produced specifically therefor; and
   growing the at least one layer by supplying material components of the compound semiconductor, of the ceramic material, or of the metallic hard material from the first material source and the second material source to the at least one planar substrate surface;
   wherein an operating temperature during the cleaning step, the terminating step, and the growing step is lower than an operating temperature in the heating step;
   wherein an operating pressure in an operational state of a vacuum-compatible reactor, in which the steps are performed, is in a range of 0.1 Pa to 10 Pa.

2. The method of claim 1, wherein the components of the compound semiconductor, of the ceramic material, or of the metallic hard material are supplied by means of sputtering, plasma-enhanced chemical vapour deposition PECVD, or by means of at least one ion cannon.

3. The method of claim 1, wherein the components of the compound semiconductor, of the ceramic material, or of the metallic hard material are supplied by means of a strip source.

4. The method of claim 1, wherein the components of the compound semiconductor, of the ceramic material, or of the metallic hard material are supplied by means of at least two different strip sources, of which at least one of said strip sources comprises an ion cannon.

5. The method of claim 1, wherein the substrate is moved in relation to at least one of the material sources at least as the steps of termination and of growth are being carried out.

6. The method of claim 1, wherein the steps of the method are performed in at least two different vacuum-compatible reactors, the reactors being connected to one another by vacuum locks.

7. A method for producing an electronic or optoelectronic component by applying a plurality of semiconductor-comprising layers to a composite body, wherein the method comprises the steps of claim 1.

8. The method of claim 7, wherein the plurality of semiconductor-comprising layers comprise interlayers configured to reduce mechanical stresses within the composite body.

9. A method for producing an electronic or optoelectronic component, the method comprising the step of applying a plurality of semiconductor-comprising layers to a composite body, wherein the composite body is manufactured according to the method of claim 1.

10. The method of claim 9, wherein the plurality of layers comprise interlayers, which serve for reducing mechanical stresses within the composite body.

11. The method of claim 9, wherein the plurality of semiconductor-comprising layers are applied by a process which is selected from a group consisting of metal-organic chemical vapour deposition ("MOCVD"), molecular beam epitaxy ("MBE"), and hydride vapour phase epitaxy ("HVPE").

12. A composite body having at least one functional layer or for the further use for producing an electronic or optoelectronic component, the composite body being in the form of a layer structure, the composite body comprising:
  at least one substrate, which is in the form of a plate and has at least one planar substrate surface; and
  at least one substantially polycrystalline or at least one substantially single-crystal layer, which comprises at least one compound semiconductor, a ceramic material or a metallic hard material;
  wherein the composite body comprises a termination layer, which is built up by a transformation of the substrate in an uppermost up to five monolayers of the substrate surface.

13. An electronic or optoelectronic component comprising at least one composite body according to claim 12.

14. A method for producing a composite body having a layer structure and comprising:
  at least one substrate, which is in the form of a plate and has at least one planar substrate surface, and
  at least one substantially polycrystalline or at least one substantially single-crystal layer, which comprises at least one compound semiconductor, a ceramic material or a metallic hard material,
  wherein the method comprises the steps of:
  heating at least part of the planar substrate surface to a temperature of at least 100° C. and at most 550° C.;
  cleaning the substrate surface by supplying hydrogen from a first material source and a plasma produced specifically therefor;
  terminating the substrate surface by applying carbon, nitrogen, or oxygen from the first material source or a second material source and a plasma produced specifically therefor; and
  growing the at least one layer by supplying material components of the compound semiconductor, of the ceramic material, or of the metallic hard material from the first material source and the second material source to the at least one planar substrate surface;
  wherein the components of the compound semiconductor, of the ceramic material, or of the metallic hard material are supplied by means of at least two different strip sources, of which at least one of said strip sources comprises an ion cannon.

* * * * *